United States Patent [19]

McGinley et al.

[11] Patent Number: 5,532,597

[45] Date of Patent: Jul. 2, 1996

[54] PASSIVE SHIMMING TECHNIQUE FOR MRI MAGNETS

[75] Inventors: John V. M. McGinley, London, England; Vishnu C. Srivastava, Highland Heights; Gordon D. DeMeester, Wickliffe, both of Ohio

[73] Assignee: Picker International, Inc., Highland Heights, Ohio

[21] Appl. No.: 334,813

[22] Filed: Nov. 4, 1994

[51] Int. Cl.$^6$ ................................................. G01V 3/00
[52] U.S. Cl. .......................................... 324/319; 324/320
[58] Field of Search .................................. 324/319, 320, 324/318, 322, 300, 307; 335/296, 299

[56] References Cited

U.S. PATENT DOCUMENTS

| | | | |
|---|---|---|---|
| 4,587,504 | 5/1986 | Brown et al. | 335/216 |
| 4,698,611 | 10/1987 | Vermilyea | 335/298 |
| 4,733,189 | 3/1988 | Punchard et al. | 324/318 |
| 4,737,716 | 4/1988 | Roemer et al. | 324/319 |
| 4,771,243 | 9/1988 | Vreugdenhil et al. | 324/320 |
| 4,853,663 | 8/1989 | Vermilyea | 335/301 |
| 4,879,538 | 11/1989 | Pausch | 335/298' |
| 5,045,794 | 9/1991 | Dorri et al. | 324/320 |
| 5,047,720 | 9/1991 | Guy | 324/320 |
| 5,179,338 | 1/1993 | Laskaris et al. | 324/318 |
| 5,235,284 | 8/1994 | Tahara et al. | 324/320 |
| 5,311,134 | 5/1994 | Yamagata et al. | 324/318 |
| 5,317,298 | 5/1994 | Dorri et al. | 335/301 |
| 5,349,297 | 9/1994 | DeMeester et al. | 324/318 |
| 5,418,462 | 5/1995 | Breneman et al. | 324/319 |

*Primary Examiner*—Louis M. Arana
*Attorney, Agent, or Firm*—Fay, Sharpe, Beall, Fagan, Minnich & McKee

[57] ABSTRACT

A subject receiving bore (12) of a magnetic resonance apparatus has an axial length to diameter ratio of less than 1.75:1 and preferably about 2:1. The temporally constant magnetic field generated by superconducting magnets (10) surrounding the bore have various magnetic field harmonic distortions generally in the Z1–Z18 range. Shim trays (80) are disposed longitudinally around the bore (12). Each shim tray contains a number of shim pockets (84) which receive ferrous shims for shimming the magnetic field in the bore (12). An initialization system (60) calibrates the initial magnetic field within the bore (12). An initial shim distribution is determined which shims the inhomogeneous magnetic field toward a target more homogeneous magnetic field. An optimization system (66) determines a residual magnetic field from a difference between the present inhomogeneous magnetic field of the bore and the target magnetic field. The amounts of ferrous material assigned to each shim pocket are optimized in fractional groups to determine an optimal shim settings to produce a shimming magnetic field equal to a negative of the residual magnetic field. In this manner, the net magnetic field is substantially equal to the target homogeneous magnetic field.

12 Claims, 3 Drawing Sheets

$s(z) = -p(z)$ $B + s(z) = B_o + p(z) - p(z) = B_o$

PASSIVE SHIMMING TECHNIQUE FOR MRI MAGNETS

BACKGROUND OF THE INVENTION

The present invention relates to the magnet arts. It finds particular application in conjunction with magnetic resonance imaging apparatus having self-shielded gradient coil assemblies and will be described with particular reference thereto. However, it is to be appreciated that the present invention will also find application in conjunction with magnetic resonance spectroscopy systems and other applications in which a polarizing magnetic field.

Magnetic resonance imagers commonly include a bore having a diameter of 90 cm or more for receiving the body of an examined patient. The bore is surrounded by a series of annular superconducting magnets for creating a substantially uniform magnetic field longitudinally through the patient receiving bore. The more axially spaced the annular magnets, the more uniform the primary magnetic field within the patient receiving bore tends to be and the longer the axial dimension over which such magnetic field uniformity exists. Typically, the length of the bore is at least 1.75 times the diameter and often twice the diameter or more. Such "long" bore magnets are designed such that there are substantially no measurable degradation from spherical harmonics below twelfth order, commonly denoted Z12.

Within the specified imaging region of a magnetic resonance imaging (MRI) magnet, the ideal magnetic field is one which is perfectly uniform. The specified imaging region is normally defined by a sphere of a specified diameter, typically 50 cm.

The bare magnet field is defined as the state of the magnetic field measured at a specified set of coordinates lying on the surface of a spherical volume when the superconducting coils of the magnet are energized, but without the presence of any additional correcting fields from whatever source. This bare magnet field is, in the ideal case, perfectly uniform by virtue of the design of the magnet. However, because of inevitable manufacturing inaccuracy, the field will actually have a finite range known as the inhomogeneity of the bare magnet. The inhomogeneity is usually defined as the range in the field expressed in parts per million of the central field. Thus, the lower this number is, the better is the field quality from an imaging point of view.

Shimming is a technique for correcting the bare magnet field for its non-uniformity. The bare magnet field can be pictured as a large constant field with a small inhomogeneous field components superimposed on that constant field. If the negative of the inhomogeneous components of the field can be generated, then the net field will be made uniform and the magnet is said to be shimmed.

Active shimming is a commonly-used method of shimming using a set of coils surrounding the spherical volume. These coils are adjusted to carry DC currents which generate magnetic fields designed to cancel out the non-uniformities of the magnet.

Passive shimming, on the other hand, uses a magnetic field arising from the induced magnetic dipole of pieces of ferromagnetic steel placed inside the magnet bore in shim trays. The shim trays are removably mounted around the magnetic bore. The prior art shim trays each extend the length of the bore and have 12–14 pockets for receiving plates of iron or steel. The shim trays are removed and plates of iron or steel are mounted in the pockets until the magnetic field sensors indicate that the Z1–Z6 harmonics have been minimized, i.e., components whose inhomogeneity behaves as $Z^1$ through $Z^6$. Typically, magnetic resonance magnets are designed without higher order components. If higher order spherical harmonics are present, they require more steel to effect a correction than do lower order harmonics. Typically, shimming for higher order harmonics also requires substantially higher positional accuracy.

The idea is to use the dipole field of the steel to compensate for the inhomogeneous component of the bare magnet field. Introducing a single piece of steel into the magnet (but outside the spherical volume), the dipole field from the steel modifies the net field throughout the spherical volume. However, in general it is unlikely that a single piece of steel would be sufficient to compensate fully for an irregularly shaped inhomogeneous field. Therefore, in general, a large array of similar pieces of steel are added at locations surrounding the spherical volume. The individual dipole fields from all the steel shim pieces is superposed. If this net superposition of dipoles cancels the original inhomogeneous field, then the field is substantially uniform.

The steel is added to shim set locations within the shim trays called pockets. This is performed in an iterative process that works well for the shimming of low order spherical harmonic components (e.g., Z1–Z6). A major disadvantage of previous techniques is that once steel is added, the shimming technique does not allow for the possibility of removing any of that steel in subsequent iterations. This leads to the use of more steel than may be optimal and also the use of more shim pocket positions than may be necessary.

The prior shimming techniques have only been successful for shimming low order components (less than or equal to Z6). Generally, these techniques are not used to shim out high order harmonic components (greater than Z6).

One of the disadvantages of long bore magnets is that the region of interest is often inaccessible to medical personnel. If a procedure is to be performed based on the image, the patient must be removed from the bore before the procedure can be performed. Moving the patient increases the risk of misregistration problems between the image and the patient. Other disadvantages of the long bore magnets is that they tend to be user-unfriendly and claustrophobic, larger magnets are more expensive than smaller magnets, and the like.

One way to improve access to the patient is to shorten the length of the magnet and the patient receiving bore. If the magnet and the bore were shortened, patient access would be much improved. Although the size of the uniform magnetic field compresses from a sphere toward a more disk-like shape, the area of substantial uniformity is still sufficient for a series of 10–20 contiguous slice images.

However, shortening the bore of the magnet has its difficulties. The magnetic field tends to become yet more non-uniform. The inventors herein have measured significant higher order harmonic distortions in such short bore magnets. The Z12 harmonic is found to be relatively strong.

In accordance with the present invention, a magnetic resonance magnet is provided which is shimmed for improved uniformity through at least the Z18 harmonic.

SUMMARY OF THE INVENTION

In accordance with one aspect of the invention, a short magnet having a length to bore ratio of less than 1.8:1 is provided. A plurality of shim trays with pockets for ferromagnetic material are disposed circumferentially around the bore. An optimization processor determines a correction magnetic field based on minimizing the sum of the squares of the difference between a target field and the magnet plus shimset field at the sample points of a field map. The optimization process or system determines the amount of ferrous material placed in each of the shim pockets surrounding the bore to balance the inhomogeneity due to construction errors, siting, and some of the designed in high order gradients.

In accordance with a more limited aspect of the present invention, the target field corresponds to a uniform field over the sample points.

In accordance with a more limited aspect of the present invention, the field maps may have 18 or more samples in the axial direction and 30 or more number of angular samples, one for each shim tray.

In accordance with a more limited aspect of the present invention, the field maps correspond to points on the surface of a cylinder or sphere.

In accordance with another more limited aspect of the present invention, there are 30 or more angular samples and 18 or more pockets in the shim trays in the axial direction.

In accordance with another more limited aspect of the present invention, the optimization process or system calculates the placement of shim material in all pockets by breaking the problem into fractional groups. A good solution is obtained by sequentially selecting different fractions for optimization.

In accordance with another more limited aspect of the present invention, shim pockets with zero and/or the maximum amount of shim material are held or trapped at these values and excluded from the optimization process. Also other pockets can be selectively masked so as to be eliminated from the optimization.

In accordance with another more limited aspect of the present invention, the changes to the distribution of shim material are limited by limiting the allowed change per pocket.

In accordance with another more limited aspect of the present invention, the initial field of the magnet is calibrated and an initial distribution of shims is determined in order to start with a field close to the target magnetic field. The initial placement may even be used to skip directly to the optimization process or system.

One advantage of the present invention is that it can be used to shim for construction errors, site, and some of the designed in high order harmonics greater than Z6.

Another advantage of the present invention is that it enables magnets of a given bore to have a reduced length while still maintaining uniformity of field.

Another advantage of the present invention is that the field map need not correspond to a particular surface such as a sphere or a cylinder. In addition, the target field need not be a uniform field. This optimization process may even shim out local field discrepancies from construction errors better than a method or system based on spherical harmonics.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
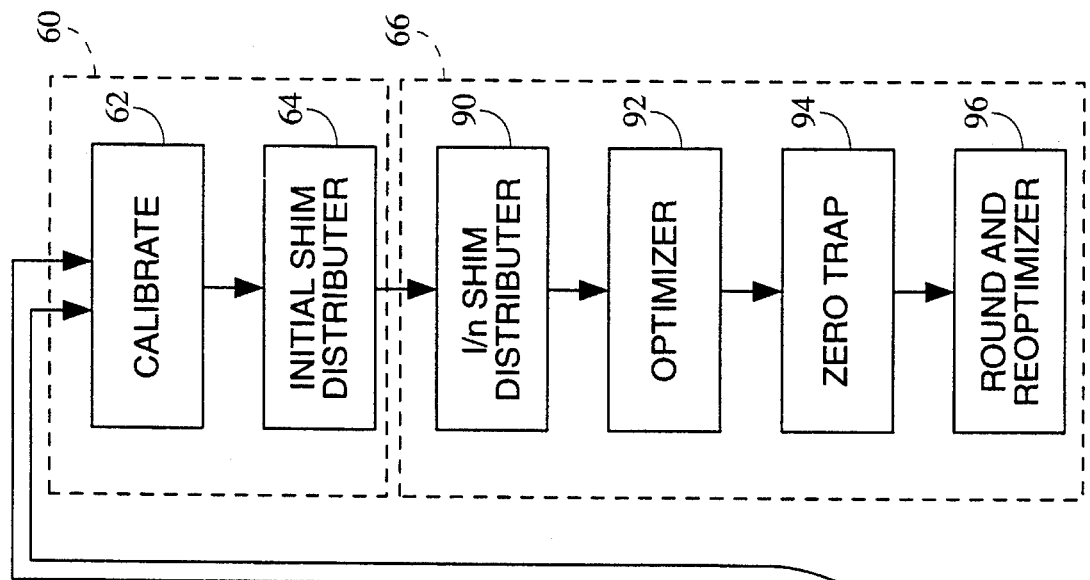
FIG. 1 is a diagrammatic illustration of a magnetic resonance imaging system in accordance with the present invention.
Figure 1:
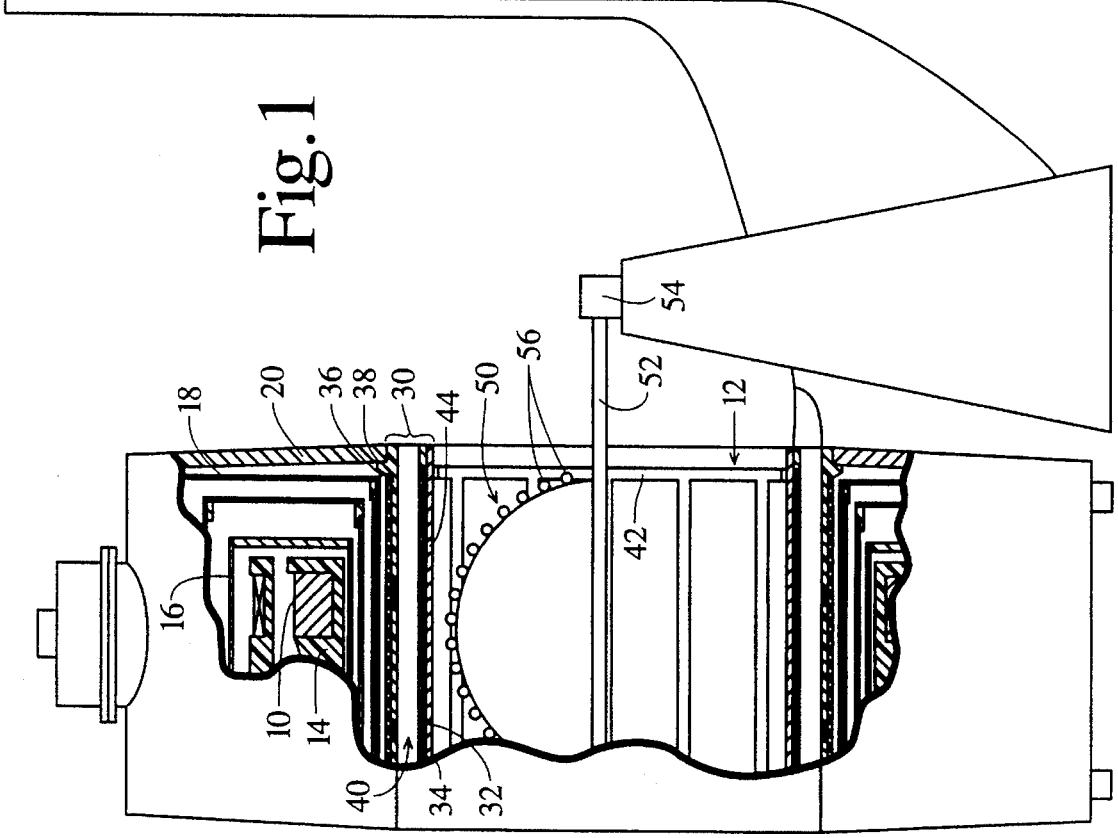

With reference to FIG. 1, a plurality of primary magnet coils 10 generate a temporally constant magnetic field along a longitudinal or z-axis of a central bore 12. The bore has a length to diameter ratio of 1.75:1 or less, preferably 1.67:1. However, shorter magnets such as a length on the order of the diameter are also contemplated. In a preferred superconducting embodiment, the primary magnetic coils 10 are supported by a former 14 and received in a toroidal helium vessel or can 16. The vessel is filled with liquid helium to maintain the primary magnet coils at superconducting temperatures. The can is surrounded by one or more cold shields 18 which are supported in a vacuum dewar 20.

A whole body gradient coil assembly 30 includes x, y, and z-gradient coils mounted around the bore 12. In the preferred embodiment, the gradient coil assembly is a self-shielded gradient coil assembly that includes primary x, y, and z-gradient coil assemblies 32 potted in a dielectric former 34 and a secondary or shield gradient coil assembly 36 that is supported on a bore defining cylinder 38 of the vacuum dewar 20. The dielectric former 34 with the potted primary gradient coils can function as a bore liner or a cosmetic bore liner can be inserted into it.

The primary and secondary gradient coil assemblies are mounted in a spaced relationship to define an annular shim receiving cavity 40 therebetween. Mechanical supports (not shown) extend through the shim receiving cavity 40 to support the primary gradient coil assembly. The supports have a minimum width in a circumferential direction to enable a plurality of shim trays to be positioned substantially side by side. In the preferred embodiment, 36 shim trays each with 24 pockets are mounted to an outer surface of the primary gradient coil assembly cylindrical former 34.

A radio frequency coil 42 is mounted inside the primary gradient coil. A radio frequency shield, e.g., a layer of copper mesh, is mounted between the radio frequency coil and the gradient coil assembly 30.

A magnetic field sensor probe 50 includes a central shaft 52 which is securely, but removably mountable along a central axis of the bore 12. A stepping motor 54 or the like selectively rotates the shaft, preferably in 10° increments. The shaft carries 24 magnetic field sensor probes 56. The probes are positioned at equal axial intervals and disposed along a half volume, such as a hemisphere or hemi-ellipse. The half volume is selected such that the probes lie along the surface of an imaging region within which the magnetic field is to be optimized by shimming. A spherical sampling volume is preferred to simplify the use of spherical coordinates for field inhomogeneity plot calculations.

In the preferred embodiment, the diameter and length of the bore have a size ratio of about 1.67:1. However, it is to be appreciated that the invention is also applicable to magnets with other geometries, particularly magnets with limited magnetic field uniformity. Typically, one might expect magnets with a bore length to diameter ratio of 1.75:1 or less to be candidates for Z12 harmonic correction. However, the present invention will also be applicable to magnetic resonance coils with longer bores in which there is a sufficient magnetic field non-uniformity in the higher order harmonics above Z6.

The starting point for the shimming process is the magnetic field map of the magnet 10. This is a series of measurements of the z-component of the magnetic field at a set of predetermined positions. The system is calibrated by an initialization system or process 60 to determine the effects of the shims on the field of the magnet. The calibration includes any parameters such as the number of shim trays, shim sizes, plot parameters, etc. Once the input field is plotted, the initialization circuit 60 rapidly calculates an initial distribution of ferrous shims which will substantially reduce the inhomogeneity for the input field plot. An initial shim distribution processor or system systematically introduces dipoles which compensate for the field harmonics pocket by pocket to develop the initial shim distribution. This initial shim distribution is not physically implemented on the shim set but is a starting point for an optimization system and process 66. Initially, shim pockets are empty. Typically, subgroups of shims in the shim set are treated independently by means of masks. A mask is a device which enables the system effectively to remove a group of shims from consideration. Alternately, a preliminary set of shims may be inserted and positioned from a priori knowledge of the magnet to reduce the inhomogeneity of the magnetic field from the start.

Once the initial distribution of shims is determined for the magnet, the optimizing system 66 uses this information to begin optimization of the uniformity of the magnetic field. The optimizing system 66 analyzes each field sampling point. The dipole strengths are varied, i.e., shims are added or deleted by computer model, to minimize the least-squares variation in the net magnetic field at the field sampling points.

Figure 2A:
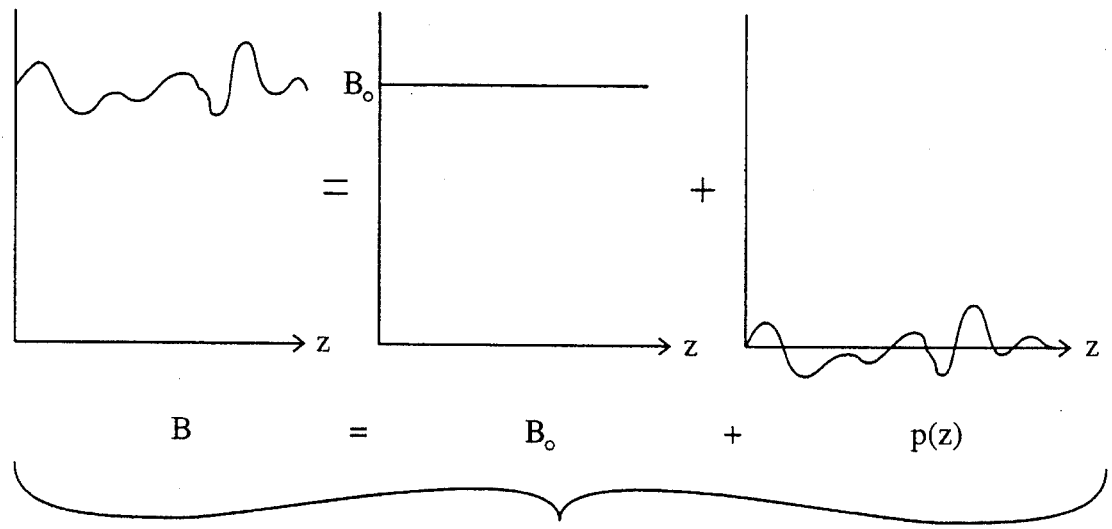
FIGS. 2A, 2B, and 2C illustrate magnetic field graphs.
Figure 2B:
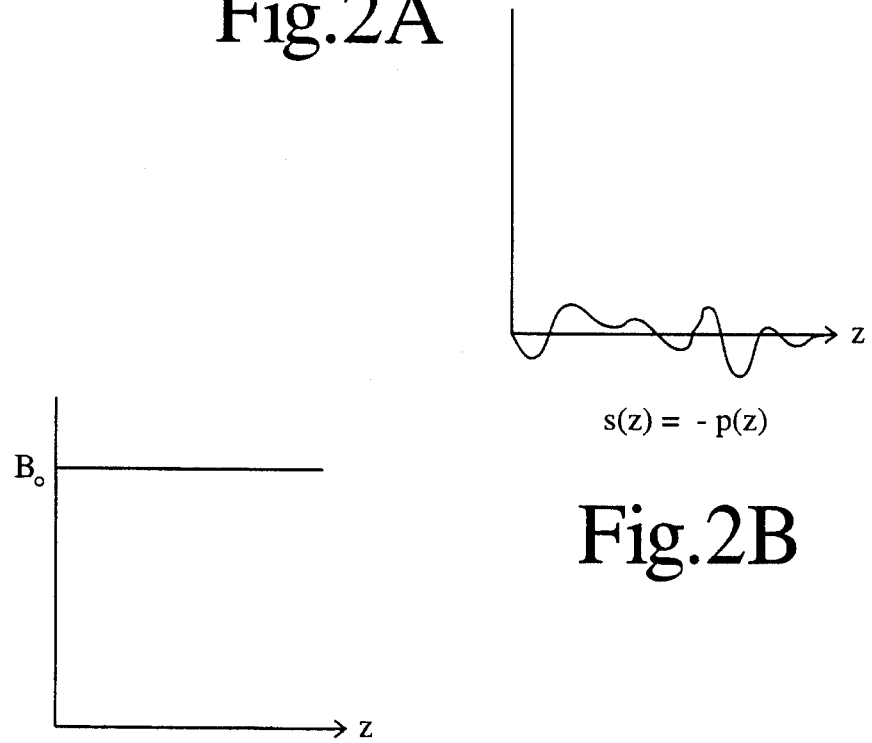
Figure 2C:
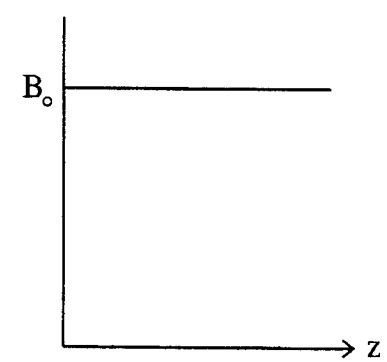

With reference to FIG. 2A, an exemplary plot of a magnetic field along a line (e.g., the z-axis) is shown for the bare magnet 10. The bare magnet field B is the sum of a large constant field $B_0$ with a smaller inhomogeneous field $p(z)$ superimposed on that constant field which is exaggerated in FIG. 2 for clarity. Adding the large constant field $B_0$ with the inhomogeneous field $p(z)$ produces the bare magnet field B. By generating a shimming magnetic field $s(z)$ equal to the negative of the inhomogeneous field $-p(z)$ (see FIG. 2B) and adding it to the overall magnetic field, a net magnetic field is produced which is equal to the constant field $B_0$ and is uniform, (see FIG. 2C).

In a preferred embodiment, upper and lower bound constraints are placed on all variables needed in order to arrive at a physically realizable shim configuration. Given that a minimum amount of shim steel in any pocket is zero and the maximum is some value $S_{max}$ which is predetermined, for any optimizing iteration there may be an amount of shim steel $y_i$ already present in shim pocket y. Thus, the lower bound for any change in position M is $-y_i$. The upper bound for any change in position M is $S_{max}-y_i$. Accordingly, the optimizing circuit has the capability to subtract as well as add steel on any given optimizing iteration.

Figure 3A:
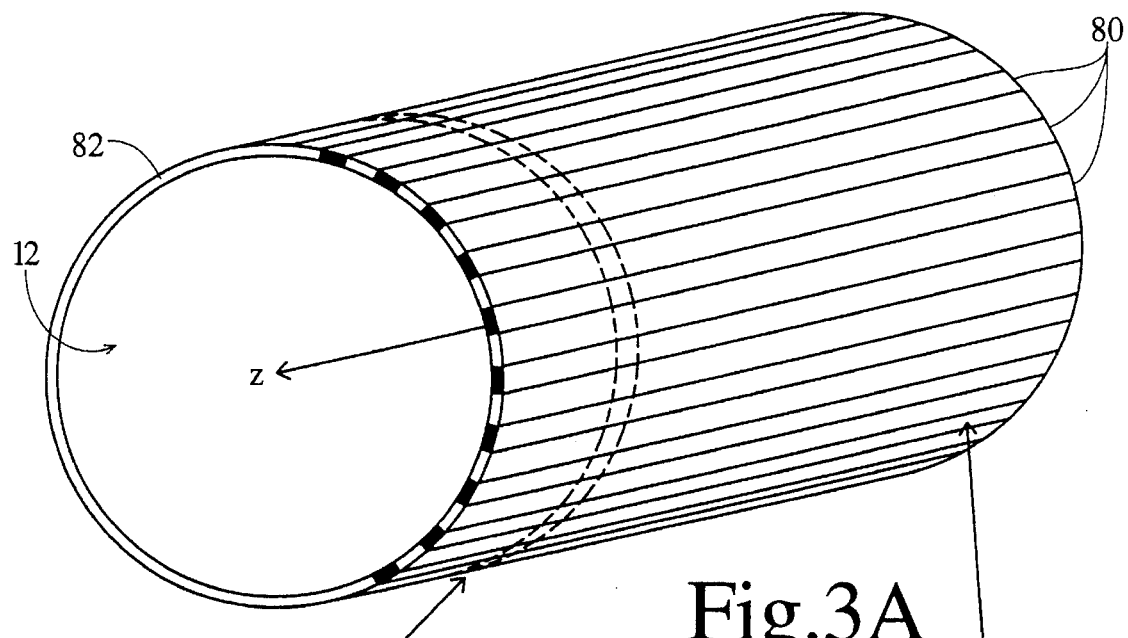
FIGS. 3A, 3B, and 3C illustrate shim trays and shim pockets.
Figure 3B:
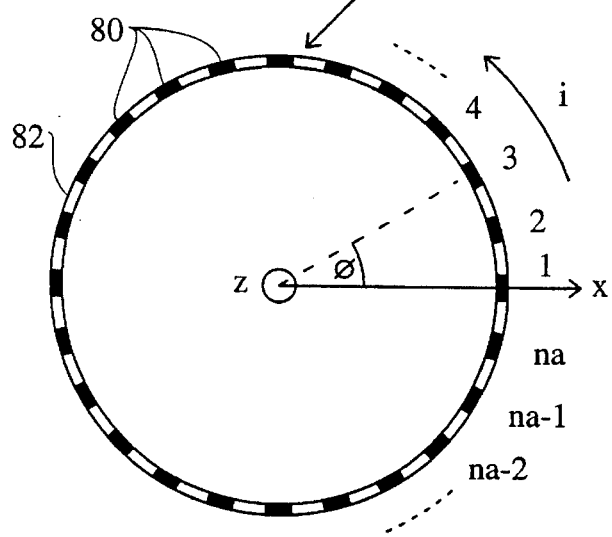
Figure 3C:
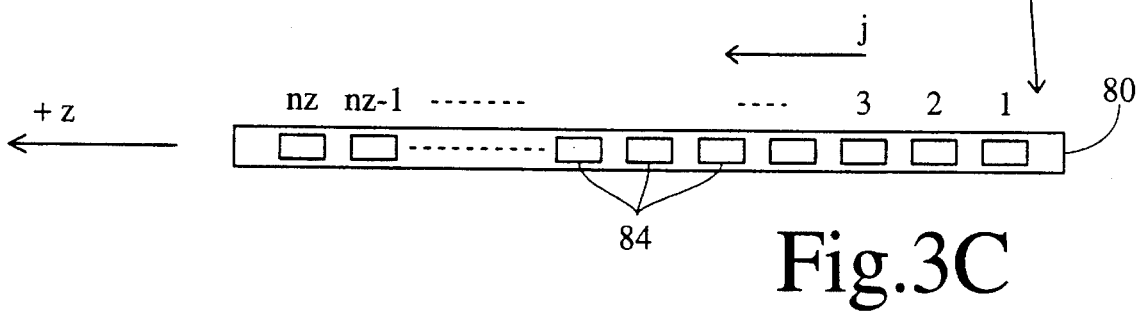

With reference to FIGS. 3A, 3B, and 3C, the passive shim set is based on a system of trays 80 which slide into the shim tray aperture 40 from one end in a direction parallel with the longitudinal or z-axis. The trays 80 are located on a cylinder 82 which is concentric with the bore 12 and the magnet 10. The angular positions of the trays are denoted by their $\phi$ coordinate of azimuthal rotation from the x-axis (from 0° to 360°). There are a total of na such rays and thus na angular tray positions as shown in the cross-sectional view of the cylinder 82. The trays 80 are numbered in order from 1 which is the tray with the minimum angular coordinate (including 0°) up to tray na which has the maximum angular coordinate (the largest angle below 360°).

On each tray 80 are a set of nz z-coordinate positions 84 with pockets which can accept a small stack of sheet steel shims. These z-positions 84 are identical for each of the shim trays 80. Thus, it is often convenient to think of the array of shim pockets 84 as being on nz rings at the specified z-positions with each ring having the same set of na angular positions at which shims may be placed. Each shim pocket 84 may either be empty (called a zero) or have some designated amount of shim steel in place (called a set shim) up to the maximum $S_{max}$. However, the maximum is limited by the physical capacity of the shim pocket.

The optimization system 66 distributes the passive shims in the pockets 84 in a reasonably symmetrical manner about the center of the magnet. Average shim patterns of previously shimmed like magnets may be used as a starting distribution. By doing so, substantial calculation time is saved and storage requirements are reduced in the passive shimming process. A preferred configuration of shim trays 80 has a total of 864 shim pockets although larger and smaller numbers of pockets are contemplated.

The optimizing system 66 processes the shim pockets using a least-squares formulation. However, the target field need not be perfectly uniform. The least-squares formulation uses the deviation of each point in the field plot from a target value to determine a residual value. The target value can be predetermined and need not be zero and preferably is a small non-zero value. This allows the anticipated high order gradients inherent to the magnetic design to be present without dominating the formulation for the correction of the low order gradients present in the field. This produces a particular advantage when the shim steel is close to the imaging volume and the steel has the capability to significantly influence the high order harmonics of the field. By setting a target field, priority between shimming the high orders and the low orders can be controlled.

An objective function F is given by:

$$F=\sqrt{g} \qquad (1),$$

where:

$$g=\frac{1}{nf}\sum_f h_f^2, \qquad (2)$$

and:

$$h_f=w_f(v_f+b_f-t_f) \qquad (3).$$

F is the square root of the mean of the square of the functions $h_f$, where f is an index representing the field points over which the field is optimized running from 1 to nf the number of field points. The position of the field point may or may not lie on a sphere depending on the shape of a desired uniform volume.

The variable $w_f$ represents a set of weighting factors for each field point by which the shimming is preferentially weighted in selected parts of the plot at the expense of other parts.

The variable $v_f$ represents the last measured field at point f. $v_f$ includes not only the field at point f without any shims present (bare magnet) but also the field at point f due to any shims which are already present from previous optimizing iterations.

The variable $b_f$ represents the total effect of all changes to the shims from their present values at point f. The functional form of $b_f$ is as follows:

$$b_f = \sum_i S_{if} y_m. \qquad (4)$$

The index i represents all the variable shims, and $Y_i$ represents the potential change in shim i. A sensitivity matrix $S_{if}$ represents the effect of unit change in shim i at field point f. The $S_{if}$ matrix is based on the geometrical relationship between shim positions m and the field points f, and a constant factor which is experimentally established for each type of magnet and shim which determines the magnitude of the dipole moment induced in a unit size of shim when placed inside the magnet.

The variable $t_f$ represents the value of the desired target field at point f. This is established for example, by calculating the field due to a historical range of high order coefficients inherent in the magnet design. Given Equations (1)–(4) and having established the values of $w_f$, $v_f$, $t_f$, and the sensitivity matrix S, all the information needed to evaluate the objective function F for any given set of changes to the shims $Y_i$ is present.

With reference again to FIG. 1, at any given optimizing stage, a subgroup of the shims is selected to be included in the next optimizing iteration by a distributor 90. Attempting to optimize all shim pockets simultaneously would take a long time and would not converge optimally. Thus, the shim pockets are optimized in approximately equal groups of 1/n of the total, where n is an integer preferably no greater than 6.

For example, an optimizing system 92 begins optimizing the shim pockets in sixths. Out of the total 720 shims, ⅙ or 120 shim locations are selected which are evenly distributed around the magnet. These 120 variables, or sampling points, are submitted to the optimizer and a distribution of Shims at these locations is found which minimizes the objective function. This includes adding or subtracting shims from each location. The objective function is a minimized least-squares variation in the net magnetic field at the sampling points. Then a second group of ⅙ shims is chosen and these are allowed to vary to further reduce the objective function. This process is repeated until all six groups of ⅙ selections have in turn been optimized. This assures that at some stage all shim locations have the opportunity to change. By optimizing a fraction of the total variables at a time, the processing executes quickly and produce an interim solution for minimizing the objective function.

The optimizing system 92 continues optimizing the shims in ever larger fractions, e.g., ⅕, ¼, ⅓, etc., each time increasing the number of variables which are allowed to vary at any given time. However, once the number of variables reaches to about 400–500, the optimizer may not converge. In this situation, the optimizing system invokes a zero trapping process or system 94 to trap zero shims, i.e., hold empty pockets empty. Zero trapping is either on or off. If zero trapping is on for any given selection of shim variables, any shim pockets which are zero (no shim material present) are automatically excluded from the optimization. This means that each of these zero shims will remain zero. By zero trapping, an advantage is achieved such that one less variable is considered by the optimizer leading to better and faster convergence.

Optimizing with zero trapping on is less general than with zero trapping off because shims do not have the ability to move away from zero after being trapped in a former sub-optimization. Therefore, zero trapping is not performed until the latter stages of optimization—preferably when optimizing in groups of ½ or larger. It is to be appreciated that zero trapping may be performed during any optimizing iteration to achieve advantages desired by those of ordinary skill in the art.

In an alternative embodiment, once the optimizing system 66 has reduced the objective function as far as possible, the optimized shim values for each shim are rounded to the nearest smallest unit size of steel available. This is performed in stages where the shims closest to the center of the magnet are rounded first. In general, this will introduce some deviation from the optimum field, so the remaining shims are reoptimized in an attempt to restore the homogeneity. The next group of shims further away from the center are then rounded and the remainder is again reoptimized. This process is repeated until all shims have been rounded into an integral number of units of steel. This prediction of steel for each shim pocket is then physically set in the magnet.

After each optimization pass a process 96 uses a least-squares fit or the like to check the deviation between the measured field and the target field. Based on the fit, the process 96 initiates another optimization process or concludes the optimization process.

Once the field is close to specification, the optimizing system stops processing and allows a user to specify a maximum magnitude of change of any shim pocket from its present value. Since there is a large redundancy in the number of nearly equivalent shimming solutions, this step avoids those solutions which would greatly disturb the shim settings present where the errors involved might mask the improvement they are trying to affect. A small "tweak" to the existing settings is more likely to pull the homogeneity into specification.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
   a bore for receiving a subject to be imaged, the bore having a diameter and an axial length with an axial length to diameter ratio of less than 2:1;
   an annular magnet surrounding the bore to generate a temporally constant inhomogeneous magnetic field axially through the bore;
   a radio frequency coil disposed around the bore and positioned to broadcast radio frequency signals into the bore and receive radio frequency signals from the bore;
   a self-shielded gradient coil assembly disposed adjacent the radio frequency coil, the self-shielded gradient coil assembly including a primary gradient coil assembly having a smaller diameter and disposed adjacent the radio frequency coil and a secondary gradient coil assembly having a larger diameter, the primary and secondary gradient coil assemblies defining a shim receiving annular region therebetween;
   an array of ferrous shim pockets disposed along an around the bore within the shim receiving annular region for receiving ferrous shims to shim magnet fields within the bore; and an optimizing system including: a means for determining a residual magnetic field, the residual magnetic field being equal to a difference between (i) the inhomogeneous magnetic field and (ii) a predetermined target magnetic field, and a means for determining in each of R optimizations adjustments to a placement of the shims in 1/n of the shim pockets to generate a negative of the residual magnetic field, the determining means including:

a distributor means for determining a group of 1/n shim pockets of the plurality of shim pockets, and an optimizer for calculating for each of the 1/n shim pockets an optimal amount of the shimming material required to produce the negative residual magnetic field.

2. A magnetic resonance imaging apparatus comprising:

a bore for receiving a subject to be imaged, the bore having a diameter and an axial length with an axial length to diameter ratio of less than 2:1;

an annular magnet surrounding the bore to generate a temporally constant inhomogeneous magnetic field axially through the bore;

a radio frequency coil disposed around the bore and positioned to broadcast radio frequency signals into the bore and receive radio frequency signals from the bore;

a self-shielded gradient coil assembly disposed adjacent the radio frequency coil, the self-shielded gradient coil assembly including a primary gradient coil assembly having a smaller diameter and disposed adjacent the radio frequency coil and a secondary gradient coil assembly having a larger diameter, the primary and secondary gradient coil assemblies defining a shim receiving annular region therebetween;

a plurality of ferrous shim pockets disposed around and along the bore within the shim receiving annular region for shimming magnet fields within the bore; and an optimizing system including:

a means for determining a residual magnetic field, the residual magnetic field being equal to a difference between the inhomogeneous magnetic field and a predetermined target magnetic field, and loop means for cyclically adjusting placement of the plurality of shims in the shim pockets to generate a negative field of the residual magnetic field, the loop means including a zero trapping circuit for disabling a shim pocket having a zero amount of shimming material, the disabled shim pocket being excluded from subsequent cyclical adjustments of the placement of shims.

3. In a magnetic apparatus which includes annular main magnets surrounding a subject receiving bore, which bore has a length to diameter ratio of less than 1.8:1, the annular magnets generating a temporally constant magnetic field through the bore, the temporally constant magnetic field being inhomogeneous due to construction errors, siting, and high order harmonic gradients above $Z6$, and shim material distributed around and along the bore in an array of shim positions for shimming the temporally constant magnetic field toward a target magnetic field within the bore, a method for optimizing the shimming of the inhomogeneous temporally constant magnetic field toward the target magnetic field comprising:

a) determining a magnetic field difference between the target magnetic field and the temporally constant magnetic field as shimmed by a proposed shim material distribution;

b) adjusting the proposed shim material distribution in accordance with the magnetic field difference;

c) determining a sum of the squares of the magnetic field difference at each of a plurality of field map points;

d) repeating steps (b) and (c) until the sum is minimized;

e) adjusting a distribution of the shim material in accordance with the proposed shim material distribution.

4. The method as set forth in claim 3 wherein the target field is a uniform magnetic field over the field points.

5. The method as set forth in claim 3 wherein there the difference between the target magnetic field and the temporally constant magnetic field as shimmed by a proposed shim material distribution is determined in the bore at least 18 field points in an axial direction along the bore and at least 30 field points peripherally around a central axis of the bore.

6. The method as set forth in claim 5 wherein the array of shim positions includes at least 18 shim positions in the axial direction and at least 30 positions peripherally around the bore.

7. The method as set forth in claim 3 wherein the field points lie on a surface of one of a sphere and a cylinder.

8. The method as set forth in claim 3 wherein steps (a)–(d) are repeated a plurality of times, each time with a different fraction of the shim positions.

9. The method as set forth in claim 3 wherein steps (a)–(d) are repeated n times, each time with 1/n-th of the shim positions, where n is an integer.

10. The method as set forth in claim 3 further including:

initially assigning a non-zero shim material distribution to each of the shim positions in the array;

repeating steps (a)–(d);

as each shim position reaches one of a preselected maximum and minimum shim material value, trapping such shim position against further adjustments in subsequent repetitions.

11. The method as set forth in claim 10 further including repeating steps (a)–(d) with a fraction of the shim positions of the shim position array.

12. The method as set forth in claim 3 further including in step (b), adjusting the proposed ferrous material distribution at each shim position by not more than a preselected maximum adjustment in each repetition.

* * * * *